United States Patent
Sridharan et al.

(10) Patent No.: US 10,056,294 B2
(45) Date of Patent: Aug. 21, 2018

(54) TECHNIQUES FOR ADHESIVE CONTROL BETWEEN A SUBSTRATE AND A DIE

(71) Applicant: Maxim Integrated Products, Inc., San Jose, CA (US)

(72) Inventors: Vivek S. Sridharan, Lewisville, TX (US); Srikanth Kulkarni, Dallas, TX (US); Khanh Tran, Milpitas, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 14/325,573

(22) Filed: Jul. 8, 2014

(65) Prior Publication Data
US 2015/0155264 A1 Jun. 4, 2015

Related U.S. Application Data

(60) Provisional application No. 61/910,601, filed on Dec. 2, 2013, provisional application No. 61/935,917, filed on Feb. 5, 2014.

(51) Int. Cl.
*H01L 21/00* (2006.01)
*H01L 21/78* (2006.01)
(Continued)

(52) U.S. Cl.
CPC .......... *H01L 21/78* (2013.01); *H01L 21/4864* (2013.01); *H01L 23/13* (2013.01);
(Continued)

(58) Field of Classification Search
CPC ............................................ H01L 2224/83002
(Continued)

(56) References Cited

U.S. PATENT DOCUMENTS 6,433,360 B1* 8/2002 Dosdos ................ G01R 1/0408
257/48
7,061,124 B2* 6/2006 Tan ........................ H01L 23/13
257/779
(Continued)

FOREIGN PATENT DOCUMENTS

CN   1406455 A    3/2003
CN   101409266 A   4/2009
CN   102208391 A  10/2011

OTHER PUBLICATIONS

Chinese Office Action dated May 17, 2018, for Chinese Application No. 201410665822.1.

*Primary Examiner* — S. V. Clark
(74) *Attorney, Agent, or Firm* — Kevin E. West; Advent, LLP

(57) ABSTRACT

Semiconductor devices are described that employ techniques configured to control adhesive application between a substrate and a die. In an implementation, a sacrificial layer is provided on a top surface of the die to protect the surface, and bonds pads thereon, from spill-over of the adhesive. The sacrificial layer and spill-over adhesive are subsequently removed from the die and/or chip carrier. In an implementation, the die includes a die attach film (DAF) on a bottom surface of the die for adhering the die to the cavity of the substrate. The die is applied to the cavity with heat and pressure to cause a portion of the die attach film (DAF) to flow from the bottom surface of the die to a sloped surface of the substrate cavity.

10 Claims, 5 Drawing Sheets

(51) Int. Cl.
*H01L 23/00* (2006.01)
*H01L 23/13* (2006.01)
*H01L 21/48* (2006.01)
*H01L 23/538* (2006.01)
*H01L 21/683* (2006.01)
*H01L 23/498* (2006.01)

(52) U.S. Cl.
CPC .............. *H01L 24/19* (2013.01); *H01L 24/83* (2013.01); *H01L 21/6836* (2013.01); *H01L 23/49816* (2013.01); *H01L 23/5389* (2013.01); *H01L 24/27* (2013.01); *H01L 24/29* (2013.01); *H01L 24/32* (2013.01); *H01L 24/73* (2013.01); *H01L 24/92* (2013.01); *H01L 2221/68327* (2013.01); *H01L 2224/04105* (2013.01); *H01L 2224/12105* (2013.01); *H01L 2224/131* (2013.01); *H01L 2224/24137* (2013.01); *H01L 2224/27003* (2013.01); *H01L 2224/27436* (2013.01); *H01L 2224/2919* (2013.01); *H01L 2224/32225* (2013.01); *H01L 2224/73267* (2013.01); *H01L 2224/83002* (2013.01); *H01L 2224/83191* (2013.01); *H01L 2224/83192* (2013.01); *H01L 2224/83203* (2013.01); *H01L 2224/83862* (2013.01); *H01L 2224/83912* (2013.01); *H01L 2224/92244* (2013.01); *H01L 2224/94* (2013.01); *H01L 2924/15156* (2013.01); *H01L 2924/15165* (2013.01)

(58) Field of Classification Search
USPC ................................................. 438/118, 119
See application file for complete search history.

(56) References Cited

U.S. PATENT DOCUMENTS

| | | | |
|---|---|---|---|
| 7,445,963 B2* | 11/2008 | Ho | H01L 21/563 257/E21.499 |
| 7,906,860 B2* | 3/2011 | Meyer | H01L 21/561 257/723 |
| 8,959,756 B2* | 2/2015 | Sakamoto | H01L 21/568 29/829 |
| 2002/0127768 A1* | 9/2002 | Badir | H01L 23/49811 438/106 |
| 2005/0110157 A1* | 5/2005 | Sherrer | G02B 6/4201 257/776 |
| 2006/0001145 A1 | 1/2006 | Ho et al. | |
| 2007/0077752 A1* | 4/2007 | Codding | H01L 21/02057 438/623 |
| 2007/0080434 A1 | 4/2007 | Ho et al. | |
| 2008/0277793 A1* | 11/2008 | Noma | H01L 21/6835 257/758 |
| 2009/0001599 A1* | 1/2009 | Foong | H01L 25/0657 257/777 |
| 2014/0252646 A1* | 9/2014 | Hung | H01L 23/481 257/774 |
| 2014/0252655 A1 | 9/2014 | Tran et al. | |
| 2014/0374031 A1* | 12/2014 | Chiou | H01L 21/6835 156/701 |
| 2015/0001733 A1* | 1/2015 | Karhade | H01L 23/538 257/774 |

* cited by examiner

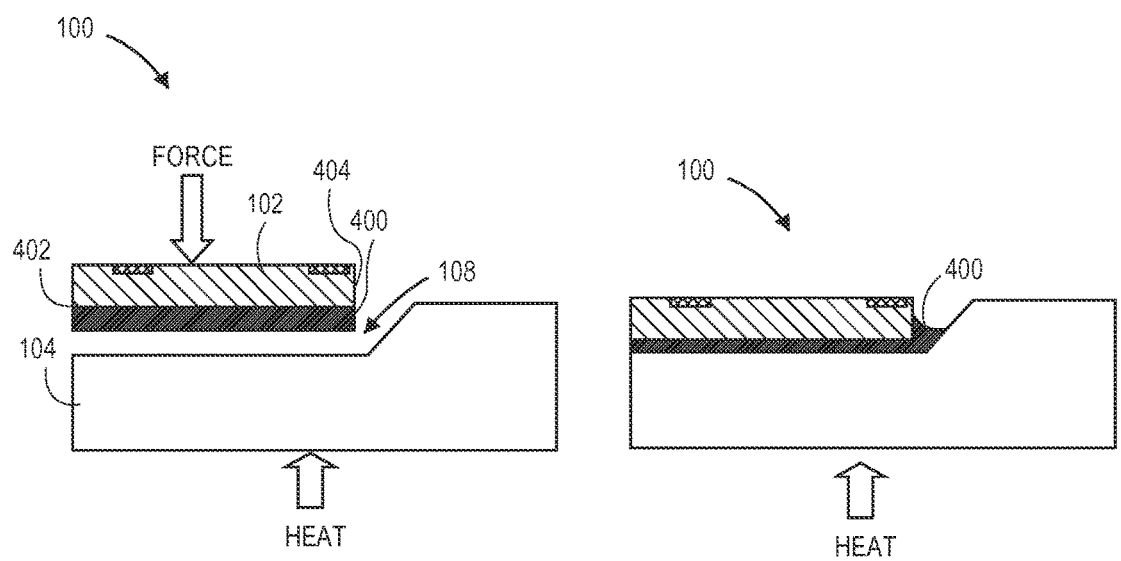

TECHNIQUES FOR ADHESIVE CONTROL BETWEEN A SUBSTRATE AND A DIE

CROSS-REFERENCE TO RELATED APPLICATIONS

The present application claims the benefit under 35 U.S.C. § 119(e) of U.S. Provisional Application Ser. No. 61/910,601, entitled TECHNIQUES FOR ADHESIVE CONTROL BETWEEN A SUBSTRATE AND A DIE, filed Dec. 2, 2013 and of U.S. Provisional Application Ser. No. 61/935,917, entitled TECHNIQUES FOR ADHESIVE CONTROL BETWEEN A SUBSTRATE AND A DIE, filed Feb. 5, 2014. U.S. Provisional Application Ser. Nos. 61/910,601 and 61/935,917 are hereby incorporated by reference in their entirety.

BACKGROUND

Traditional fabrication processes used in the manufacture of semiconductor devices employ microlithography to pattern integrated circuits onto a circular wafer formed of a semiconductor, such as silicon or the like. Typically, the patterned wafers are segmented into individual integrated circuit chips, or dies, to separate the integrated circuits from one another. The individual integrated circuit chips are assembled or packaged using a variety of packaging technologies to form semiconductor devices that may be mounted to a printed circuit board.

Over the years, packaging technologies have evolved to develop smaller, cheaper, more reliable, and more environmentally-friendly packages. For example, chip-scale packaging technologies have been developed that employ direct surface mountable packages having a surface area that is no greater than 1.2 times the area of the integrated circuit chip. Wafer-level packaging is an emerging chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

SUMMARY

Semiconductor devices are described that employ techniques configured to control adhesive application between a substrate and a die. Wafer-level chip-scale package devices include a chip carrier substrate having cavities therein to receive a die. For example, the cavities may be sloped cavities that are configured to receive the die, where an adhesive (e.g., an epoxy or glue) holds the die within the cavity. In an implementation, a sacrificial layer is provided on a top surface of the die to protect the surface, and bond pads thereon, from spill-over of the adhesive. The sacrificial layer and spill-over adhesive are subsequently removed from the die and/or chip carrier. In an implementation, the die includes a die attach film (DAF) on a bottom surface of the die for adhering the die to the cavity of the substrate. The die is applied to the cavity with heat and pressure to cause a portion of the die attach film (DAF) to flow from the bottom surface of the die to a side surface of the substrate cavity.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIG. 4A is a diagrammatic partial cross-sectional elevation view of a die having a die attach film (DAF) on a bottom surface of the die in accordance with an example implementation of the present disclosure, wherein the die is to be applied upon pressure to a heated substrate.

FIG. 4B is a diagrammatic partial cross-sectional elevation view of the die mounted to the substrate of FIG. 4A, wherein a portion of the die attach film (DAF) flowed out from under the die.

DETAILED DESCRIPTION

Overview

Figure 1A:
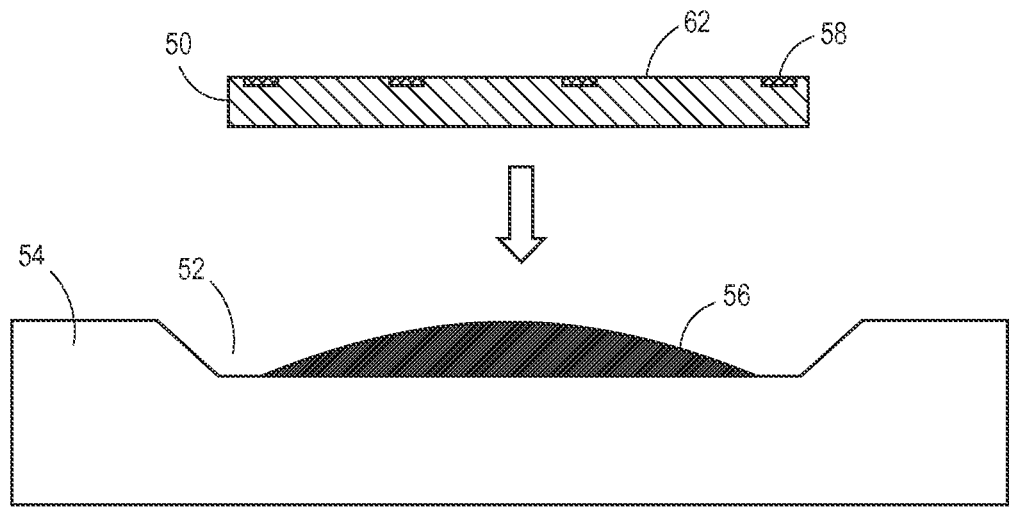
FIG. 1A is a diagrammatic cross-sectional side elevation view illustrating a wafer-level chip-scale package device, with a die to be secured to a substrate with an adhesive.
Figure 1B:
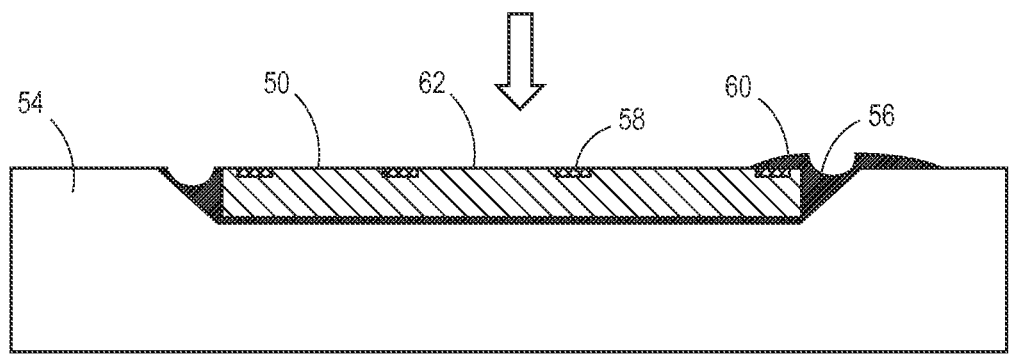
FIG. 1B is a diagrammatic cross-sectional elevation view illustrating the wafer-level chip-scale package device of FIG. 1B with the die mounted to the substrate.

Wafer-level packaging facilitates the production of semiconductor devices that are lower in cost, have smaller form factors, and provide lower parasitic effects than devices manufactured utilizing many other packaging technologies. However, wafer-level package bump pitch is scaling faster than printed circuit board (PCB) pad pitch. Substrates are designed with cavities (e.g., sloped, rectangular, and so forth) to receive dies, such that bump pitch of the wafer-level package can fan-out (e.g., with redistribution layers) to match the printed circuit board (PCB) pad pitch. The die can be mounted to the substrate via an adhesive, such as an epoxy, a glue, and so forth. For example, as shown in FIGS. 1A and 1B, a die 50 is configured to mount to a cavity 52 of a substrate 54, via an adhesive 56. The die 50 includes a plurality of bonds pads 58 to provide electrical connectivity to the die 50. Fluid properties of the adhesive can cause the adhesive to impact sidewalls of the substrate and spill-over onto a top surface of the die, which can interfere with (e.g., coat, cover, or otherwise inhibit electrical conductivity of) the bond pad on the die. For example, when the die 50 is positioned into the cavity 52, a portion 60 of adhesive 56 may flow onto a top surface 62 of the die, which can cover at least a portion of one or more bond pads 58.

Accordingly, semiconductor devices are described that employ techniques configured to control adhesive application between a substrate and a die, and are configured for wafer-level chip-scale packaging. For example, the substrate may include cavities (e.g., sloped, rectangular, and so forth) that are configured to receive the die. An adhesive (e.g., an epoxy or glue) mounts the die within the cavity. In an implementation, a sacrificial layer is provided on a top surface of the die to protect the surface, and bond pads thereon, from spill-over of the adhesive. The sacrificial layer and spill-over adhesive are subsequently removed from the die and/or chip carrier. In an implementation, the die includes a die attach film (DAF) on a bottom surface of the die for adhering the die to the cavity of the substrate. The die is applied to the cavity with heat and pressure to cause a portion of the die attach film (DAF) to flow from the bottom surface of the die to a side surface of the substrate cavity.

Example Implementations

FIGS. 2A through 4B illustrate a wafer-level chip-scale package device 100 in accordance with example implementations of the present disclosure. As shown, the devices 100 include a die 102 configured to be mounted to a substrate 104 via an adhesive 106. The substrate 104 includes one or more cavities 108 formed therein. The size and/or shape of the die 102 may depend on the complexity, configuration, design characteristics, etc. of the integrated circuits to be implemented in the wafer-level chip-scale package device 100. The size and/or shape of the cavities 108 may depend on the corresponding size and/or shape of the die 102. For example, the cavities 108 may include sloped sidewalls extending outwardly from a bottom surface of the substrate 104, such as shown in FIGS. 2A through 4B. In some embodiments, the cavities 108 may include sidewalls extending vertically from a bottom surface of the substrate to form a square or rectangular cavity 108. In some embodiments, the cavities 108 may form irregular or non-patterned shapes. The cavities 108 may be formed in the substrate by etching the substrate, such as by standard etching processes. For example, the cavities 108 can be etched into the substrate 104 using a wet etching process (implementing a wet etchant, such as potassium hydroxide), a dry etching (e.g., plasma etching) process, such as deep reactive ion etching (DRIE), or a combination of both.

Figure 2A:
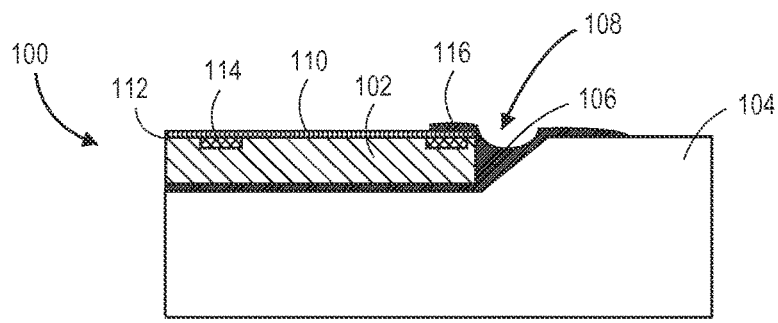
FIG. 2A is a diagrammatic partial cross-sectional elevation view of a die mounted to a substrate in accordance with an example implementation of the present disclosure, wherein the die includes a sacrificial layer on a top surface of the die.

In an implementation, as shown in FIG. 2A, the wafer-level chip-scale package device 100 includes a sacrificial layer 110 positioned on a top surface 112 (e.g., the surface distal the substrate 104) of the die 102. The sacrificial layer 110 is configured to cover at least a portion of the top surface 112 of the die 102 to provide protective functionality to the die 102. For example, the sacrificial layer 110 can cover one or more bond pads 114 of the die 102 to prevent contact between the bond pads 114 and any spill-over adhesive 106.

The sacrificial layer 110 can be a polymer layer, a resist layer, and so forth, deposited on the die 102 according to a variety of application methods, such as, for example, deposition techniques, sputtering techniques, and so forth. In one or more implementations, the material of sacrificial layer 110 is selected based on a desired interaction between the layer and the adhesive, such as by designation of a contact angle of the material or a wettability of the material. For example, in an implementation, the sacrificial layer 110 comprises PBO (poly(p-phenylene-2,6-benzobisoxazole)) or other polymer.

Figure 2B:
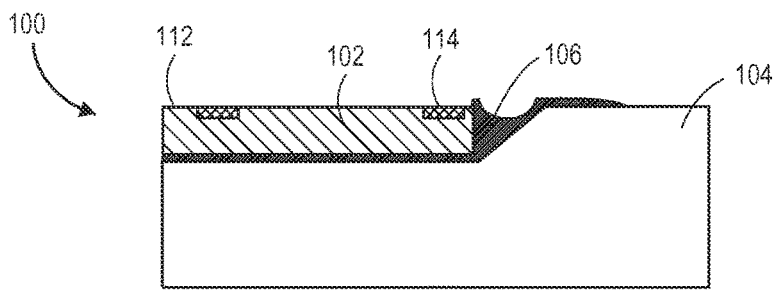
FIG. 2B is a diagrammatic partial cross-sectional elevation view of the die mounted to the substrate of FIG. 2A with the sacrificial layer removed.

In particular implementations, the sacrificial layer 110 is applied to the die 102 prior to introducing the die 102 to the adhesive 106 within the cavity 108 of the substrate 104. Once the die 102 is mounted, the sacrificial layer 110 can be removed to remove any spill-over adhesive (shown as 116 in FIG. 2A) accumulated on the sacrificial layer 110. The technique to remove the sacrificial layer 110 will depend on the material used for the sacrificial layer 110. For example, the sacrificial layer 110 may be removed with a solvent, such as NMP (N-Methyl-2-pyrrolidone), configured to dissolve or weaken a binding ability of at least a portion of the sacrificial layer 110. FIG. 2B shows an implementation of the device 100 having the sacrificial layer 110 (and associated spill-over adhesive) removed. In an implementation, the adhesive 106 is at least partially cured prior to removal of the sacrificial layer 110 with NMP. The partial curing may prevent removal of the adhesive 106 with the solvent used to remove the sacrificial layer 110. For example, an epoxy adhesive may be cured at about 120° C. for about an hour to provide resistive functionality to prevent removal of the adhesive by the NMP solvent. In one or more implementations, the device 100 may be treated after stripping the sacrificial layer 110 to remove portions of the spill-over adhesive from proximity near the top surface 112 of the die 102. For example, a high pressure water stream may be used to clean the portions of the spill-over adhesive that were in contact with the sacrificial layer 110 prior to stripping the sacrificial layer 110.

Figures 3A, 3B:
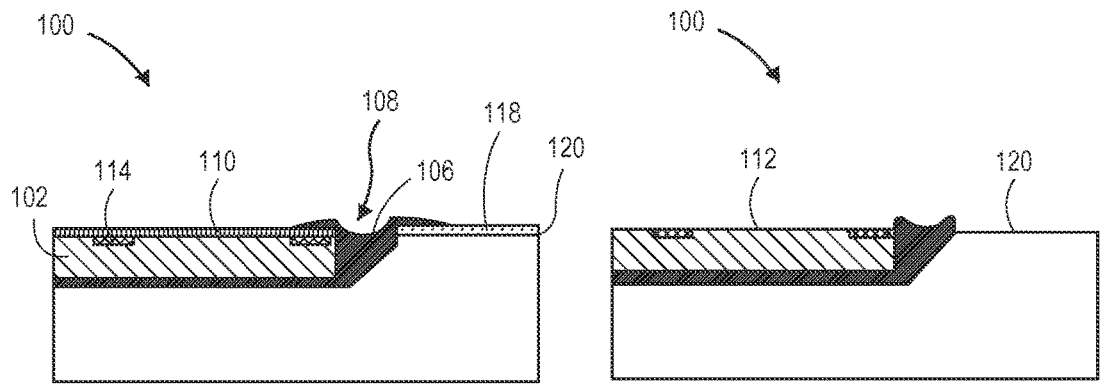
FIG. 3A is a diagrammatic partial cross-sectional elevation view of the die mounted to the substrate of FIG. 2A, where the substrate includes a sacrificial layer on a top surface of the substrate.
FIG. 3B is a diagrammatic partial cross-sectional elevation view of the die mounted to the substrate of FIG. 3A with the sacrificial layers removed from the die and the substrate.

In one or more implementations, such as shown in FIG. 3A, the device 100 includes the sacrificial layer 110 on the die 102 and an additional sacrificial layer 118 on a top surface 120 of the substrate 104. The sacrificial layer 118 on the substrate 104 may comprise the same or different material than that of the sacrificial layer 110 on the die 102. The sacrificial layer 118 may be configured to provide protective functionality to the top surface 120 of the substrate 104. For example, the sacrificial layer 118 can cover at least a portion of the top surface 120 to prevent contact between the top surface 120 and any spill-over adhesive 106. FIG. 3B shows the device 100 after the sacrificial layers 110, 118 are removed (such as by stripping with an NMP solvent) and the spill-over adhesive 106 being washed from the surfaces 112, 120. As can be seen, the top surface 112 of the die 102 and the top surface 120 of the substrate 104 are substantially free of the adhesive 106, with the die 102 mounted in the cavity 108.

In one or more implementations, such as shown in FIGS. 4A and 4B, the device 100 includes the die 102 to be mounted in the cavity 108 of the substrate 104. In these implementations, the adhesive is a Die Attach Film (DAF) 400 secured to a bottom surface 402 of the die 102. For example, the DAF 400 may be integrated as part of the dicing tape used during the segmenting or dicing process used to generate the die 102, causing the DAF 400 to be secured to the bottom surface 402 of the die 102. In implementations, the DAF 400 has a thickness of less than approximately 75 microns, and in a particular implementation, has a thickness of approximately 30 microns. The DAF 400 may be malleable, such that under pressure and temperature, the DAF 400 may flow out from underneath the die 102 within the cavity 108. For example, in one or more implementations, the die 102 with the DAF 400 is applied, under pressure, to the cavity 108 of the substrate 104, where the substrate 104 is actively heated, causing the DAF 400 to flow out from underneath the die 102, as shown in FIG. 4B. The DAF 400 may flow out from underneath the die 102 to contact one or more sidewalls 404 of the die 102. For example, in an implementation, the DAF 400 may flow out from underneath the die 102 to contact one or more sidewalls 404 at a height of approximately one fourth of the height of the sidewall 404 down from the top surface of the die (e.g., from top surface 112, as shown in FIG. 3B). For instance, the DAF 400 may contact the sidewall 404 upwards from the cavity 108, covering approximately three-fourths of the distance between the cavity 108 and the top surface 112 of the die 102. In implementations, the DAF 400 contacts the sidewall 404 at the top surface 112 of the die 102. For instance, the DAF 400 may contact the sidewall 404 upwards from the cavity 108 to the top surface 112 of the die 102. However, when the die 102 is applied under controlled pressure and temperature, the application of the DAF 400 may be controlled to avoid spill-over onto the top surface 112 of the die.

In implementations, the device 100 includes one or more of the sacrificial layer 110 on the die 102 and the sacrificial layer 118 on the substrate in combination with the DAF 400 on the die 102. Such a combination may aid in preventing spill-over of any DAF 400 that may occur due to undesirable process conditions, including but not limited to, improper/mistargeted die placement.

Example Fabrication Processes

Figure 5:
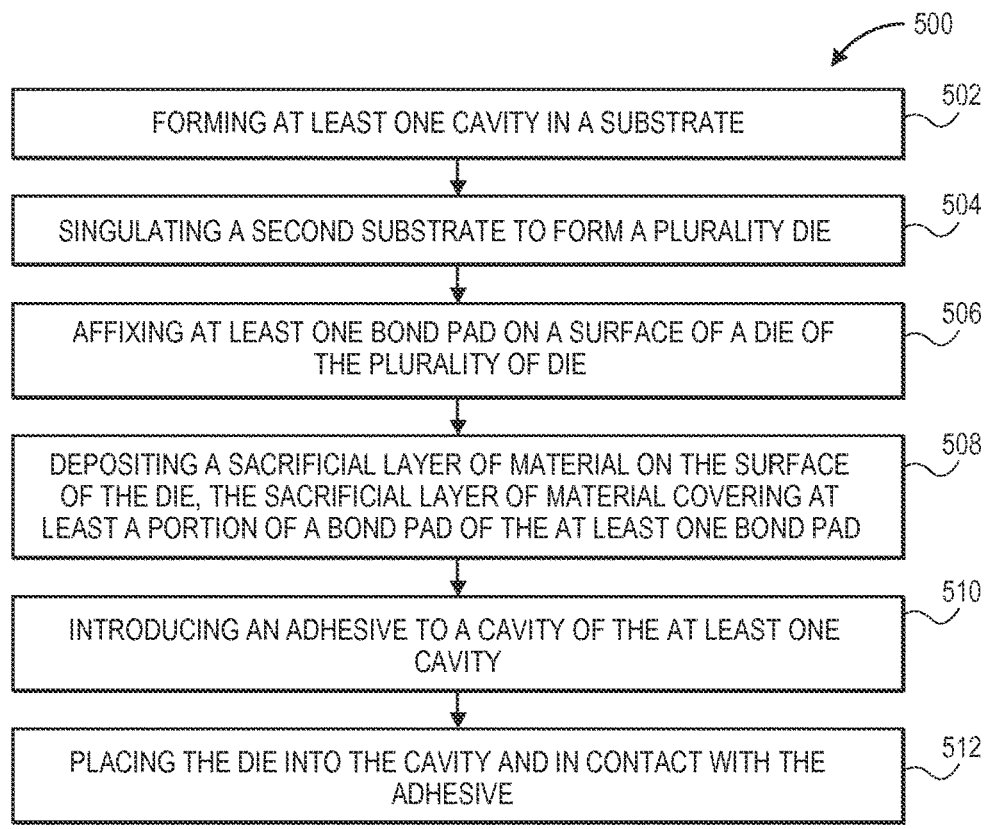
FIG. 5 is a flow diagram of an example process for fabricating a packaging structure in accordance with an example implementation of the present disclosure.

FIG. 5 illustrates an example process 500 that employs wafer-level packaging techniques to fabricate semiconductor devices, such as the devices 100 shown in FIGS. 2A through 3B. In the process 500 illustrated, at least one cavity is formed in a substrate (Block 502). For example, as shown in FIGS. 2A through 4B, cavity 108 is formed in the substrate 104, such as through an etching technique. Process 500 also includes singulating a second substrate to form a plurality of die (Block 504). Die 102 illustrates an example die singulated from a substrate. Process 500 also includes affixing at least one bond pad on a surface of a die of the plurality of die (Block 506). As shown in FIGS. 2A through 4B, bond pads 114 are affixed to the top surface 112 of the die 102. Block 508 of process 500 illustrates depositing a sacrificial layer of material on the surface of the die, where at least a portion of the sacrificial layer of material covers at least a portion of a bond pad of the at least one bond pad. For example, as shown in FIGS. 2A and 3A, the sacrificial layer 110 is applied to the top surface 112 of the die 102, covering at least a portion of one or more bond pads 114 of the die 102. The sacrificial layer 110 can prevent contact between the bond pads 114 and any spill-over adhesive 106, where the adhesive can interfere with the electrical connective functionality of the bond pad 114. Block 510 of process 500 illustrates introducing an adhesive to a cavity of the at least one cavity. For example, an epoxy of glue-based adhesive can be deposited into cavity 108, as shown in FIGS. 2A through 3B. Process 500 further includes placing the die into the cavity and in contact with the adhesive (Block 512). For example, as shown in FIGS. 2A through 3B, the die 102 is introduced into cavity 108 and in contact with the adhesive 106 to mount the die 102 to the substrate 104.

Figure 6:
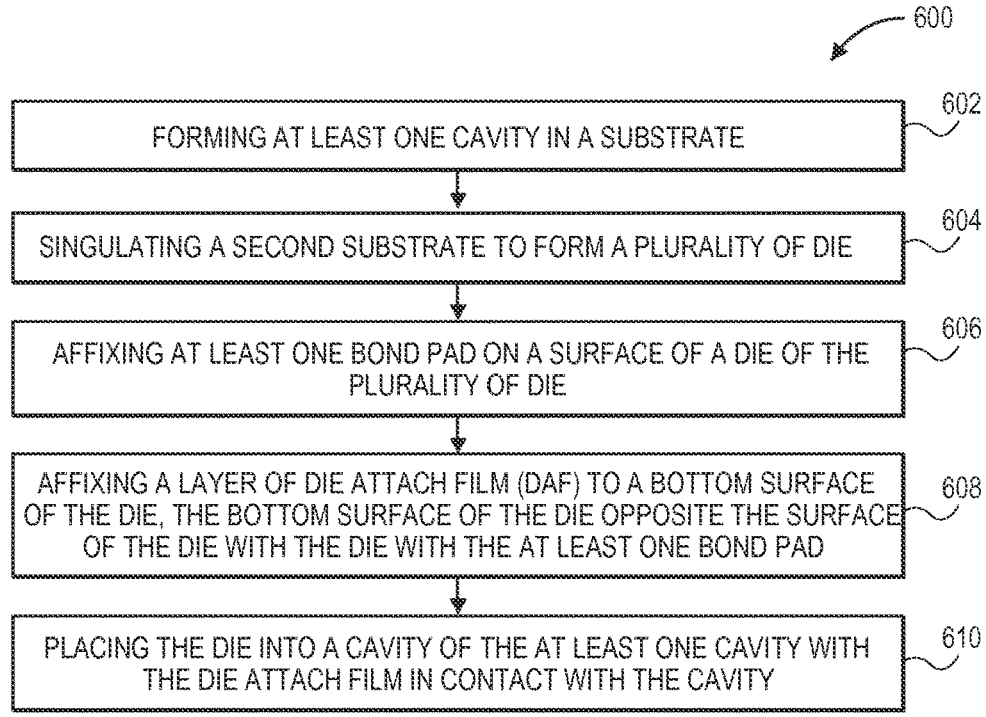
FIG. 6 is a flow diagram of an example process for fabricating a packaging structure in accordance with an example implementation of the present disclosure.

Referring now to FIG. 6, an example process 600 is shown that employs wafer-level packaging techniques to fabricate semiconductor devices, such as the devices 100 shown in FIGS. 4A and 4B. In the process 600 illustrated, at least one cavity is formed in a substrate (Block 602). For example, as shown in FIG. 4A, cavity 108 is formed in the substrate 104, such as through an etching technique. Process 600 also includes singulating a second substrate to form a plurality of die (Block 604). Die 102 illustrates an example die singulated from a substrate. Process 600 also includes affixing at least one bond pad on a surface of a die of the plurality of die (Block 606). As shown in FIGS. 2A through 4B, bond pads 114 are affixed to the top surface 112 of the die 102. Block 608 of process 600 illustrates affixing a layer of die attach film (DAF) to a bottom surface of the die, where the bottom surface of the die is opposite the surface of the die with the at least one bond pad. For example, as shown in FIG. 4A, the die attach film (DAF 400) is attached to the bottom surface 402 of the die 102, where the bottom surface 402 is generally opposite the top surface 102 having the bond pads 114 affixed thereto. Block 610 of process 600 illustrates placing the die into the cavity, with the die attach film in contact with the cavity. For example, as shown in FIGS. 4A and 4B, the die 102 is introduced into cavity 108, where the DAF 400 is in contact with the cavity 108 of the substrate 104.

Figure 7:
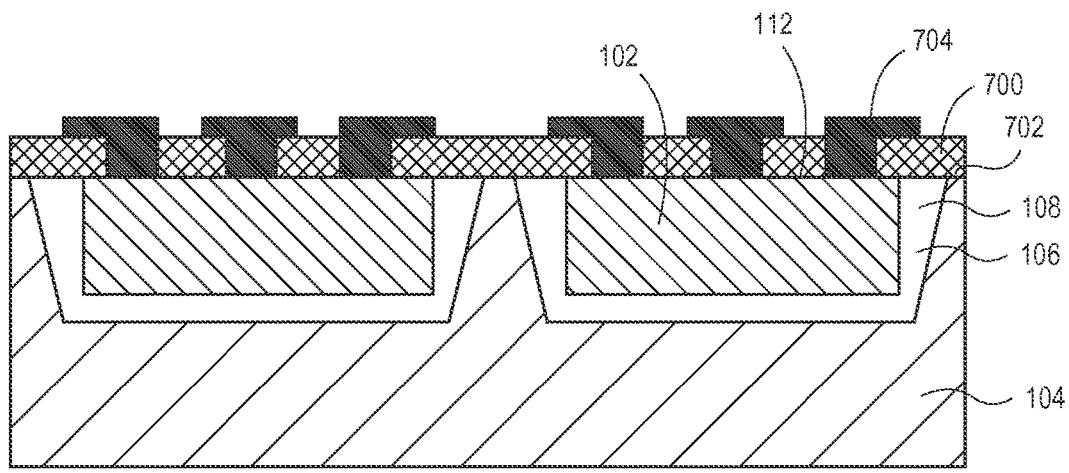
FIG. 7 is a diagrammatic partial cross-sectional elevation view of a packaging structure of a die mounted to a substrate in accordance with an example implementation of the present disclosure.
Figure 8:
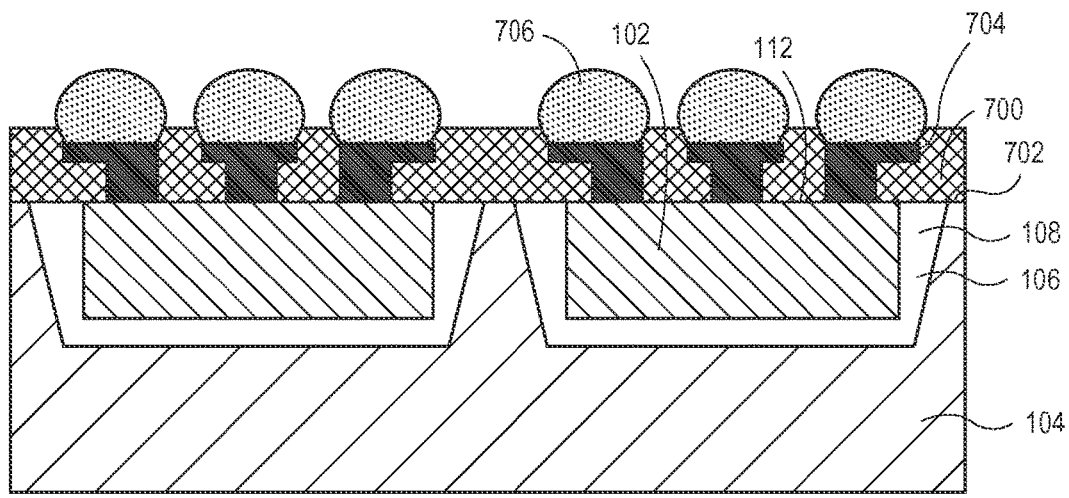
FIG. 8 is a diagrammatic partial cross-sectional elevation view of a packaging structure having incorporated solder bumps in accordance with an example implementation of the present disclosure.

Processes 500 and 600 may further include a step of forming a passivation layer (e.g., dielectric layer with conformal or planarized surface) on the substrate. FIGS. 7 and 8 each show a passivation layer 700 formed on a top surface 702 of the substrate 104 in accordance with embodiments of the present disclosure. In embodiments, the passivation layer 700 is also formed over the cavity 108 and upon the top surface 112 of the die 102. In embodiments, processes 500 and 600 include a step of patterning, etching the passivation layer to create openings (i.e., vias) to the top-level metal of the embedded die, and metallizing within the vias and upon the passivation layer to form metal interconnects 704 of a redistribution layer. In embodiments, the redistribution layer re-routes some or all connections from the area coinciding with the die 102 to the area coinciding with the carrier substrate 104. This configuration can be referred to as a fan-out structure. In fan-out embodiments, the top surface of the substrate can be used to expand the connection area between the carrier substrate and the active circuitry of the die. In embodiments, processes 500 and 600 further include a step of forming solder bumps upon the redistribution layer. Such redistribution layer may be used to enable larger solder bumps that would not otherwise fit within the original area of the embedded die. FIG. 8 shows the solder bumps 706 upon the redistribution layer. In implementations, the package structures described herein include multiple (e.g., two or more) dies positioned on the substrate. For example, the substrate can include multiple cavities, where one die is positioned in one cavity and another die is positioned in an adjacent cavity. Where the package includes multiple dies, the dies can be electrically connected to one or more other dies within the package. By utilizing multiple dies, one or more of the dies can differ from respective other dies in function, size, configuration, and so forth.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A method for fabricating a packaging structure, the method comprising:
   forming at least one cavity in a substrate;
   singulating a second substrate to form a plurality of die;
   affixing at least one bond pad on a surface of a die of the plurality of die;
   depositing a sacrificial layer of material directly on the surface of the die, the sacrificial layer of material including a resist layer, the sacrificial layer of material covering at least a portion of a bond pad of the at least one bond pad;
   introducing an adhesive to a cavity of the at least one cavity;
   placing the die into the cavity and in contact with the adhesive, the sacrificial layer of material configured to protect the at least a portion of a bond pad of the at least one bond pad from spill-over adhesive; and
   removing the sacrificial layer of material from the surface of the die after placing the die in contact with the adhesive.

2. The method of claim 1, wherein removing the sacrificial layer of material includes introducing a solvent to the sacrificial layer of material.

3. The method of claim 2, wherein the solvent includes N-Methyl-2-pyrrolidone (NMP).

4. The method of claim 1, further comprising at least partially curing the adhesive prior to removing the sacrificial layer of material.

5. The method of claim 1, further comprising treating the die with a pressurized fluid to remove spill-over adhesive previously in contact with the sacrificial layer before the sacrificial layer was removed.

6. The method of claim 1, wherein the sacrificial layer includes poly(p-phenylene-2,6-benzobisoxazole) (PBO).

7. The method of claim 1, further comprising depositing a second sacrificial layer of material on a surface of the substrate adjacent the cavity of the at least one cavity.

8. The method of claim 7, further comprising removing the second sacrificial layer of material from the surface of the substrate after placing the die in contact with the adhesive.

9. The method of claim 1, wherein the adhesive contacts a sidewall of the die after the die is placed in contact with the adhesive, and wherein the adhesive contacts the sidewall at the surface of the die.

10. The method of claim 1, wherein the adhesive contacts a sidewall of the die at a location between the surface of the die and the cavity after the die is placed in contact with the adhesive.

* * * * *